(12) United States Patent
Kim et al.

(10) Patent No.: US 11,618,940 B2
(45) Date of Patent: Apr. 4, 2023

(54) METHOD OF MANUFACTURING DISPLAY APPARATUS

(71) Applicant: Samsung Display Co., Ltd., Yongin-si (KR)

(72) Inventors: Kyubum Kim, Yongin-si (KR); Sungjin Kim, Yongin-si (KR); Chunyoung Park, Yongin-si (KR); Uno Chang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 483 days.

(21) Appl. No.: 16/531,866

(22) Filed: Aug. 5, 2019

(65) Prior Publication Data

US 2020/0140989 A1    May 7, 2020

(30) Foreign Application Priority Data

Nov. 5, 2018 (KR) .................. 10-2018-0134444

(51) Int. Cl.
*C23C 14/04* (2006.01)
*H01L 51/56* (2006.01)
*G03F 7/20* (2006.01)
*H01L 21/687* (2006.01)
(Continued)

(52) U.S. Cl.
CPC ........... *C23C 14/042* (2013.01); *G03F 7/707* (2013.01); *G03F 7/70733* (2013.01); *H01L 21/67745* (2013.01); *H01L 21/68764* (2013.01); *H01L 21/68778* (2013.01); *H01L 51/56* (2013.01); *B05B 12/22* (2018.02);
(Continued)

(58) Field of Classification Search
CPC .............................. C23C 14/042; C23C 14/04
See application file for complete search history.

(56) References Cited

U.S. PATENT DOCUMENTS 8,686,819 B2 * 4/2014 Schuessler .............. G03F 7/707
335/289
8,688,433 B2 * 4/2014 Davis .................... H04L 51/046
704/7
(Continued)

FOREIGN PATENT DOCUMENTS

JP    2010-106359 A    5/2010
JP       6321311 B2    5/2018
(Continued)

OTHER PUBLICATIONS

Tseng, Ching-Chang, et al., "Thin Silicon Shadow Masks for Organic Light Emitting Diodes (OLED) Deposition Processes". Proc. SPIE 6414, Smart Structures, Devices, and Systems III, 64141G (Jan. 8, 2007) pp. 1-9, doi: 10.1117/12.692440.*
(Continued)

*Primary Examiner* — Bret P Chen
(74) *Attorney, Agent, or Firm* — Lewis Roca Rothgerber Christie LLP

(57) ABSTRACT

A method of manufacturing a display apparatus includes: sequentially fixing a display substrate and a mask assembly to a carrier; transporting the mask assembly and the display substrate to a deposition unit via the carrier; and depositing a deposition material on the display substrate by passing the deposition material through the mask assembly, by using the deposition unit.

5 Claims, 7 Drawing Sheets

(51) Int. Cl.
*H01L 21/677* (2006.01)
*B05B 12/22* (2018.01)

(52) U.S. Cl.
CPC ............. *H01L 2221/67* (2013.01); *H01L 2224/03002* (2013.01); *H01L 2224/0345* (2013.01)

(56) References Cited

U.S. PATENT DOCUMENTS

| | | | | |
|---|---|---|---|---|
| 8,776,718 B2* | 7/2014 | Park | ............. | B05C 21/005 |
| | | | | 118/504 |
| 9,016,234 B2 | 4/2015 | Ko | | |
| 9,045,818 B2* | 6/2015 | Gersdorff | .......... | H01L 21/68742 |
| 9,530,961 B2* | 12/2016 | Yi | ............. | H01L 51/56 |
| 10,304,713 B2* | 5/2019 | White | .............. | C23C 16/345 |
| 10,626,492 B2* | 4/2020 | Yi | .................. | C23C 14/042 |
| 10,651,385 B2* | 5/2020 | Chang | ............. | H01L 51/0011 |
| 10,837,111 B2* | 11/2020 | Vercesi | ............ | C23C 14/50 |
| 2004/0062856 A1* | 4/2004 | Marcus | ............. | H01L 51/0002 |
| | | | | 427/66 |
| 2006/0086321 A1* | 4/2006 | Brody | ............. | C23C 14/042 |
| | | | | 118/728 |
| 2006/0164786 A1* | 7/2006 | Kobayashi | ............ | H02N 13/00 |
| | | | | 361/234 |
| 2006/0240669 A1* | 10/2006 | Kaneko | ............. | C23C 14/564 |
| | | | | 438/680 |
| 2008/0136757 A1* | 6/2008 | Iwata | ............. | H01L 27/1203 |
| | | | | 345/87 |
| 2010/0044974 A1* | 2/2010 | Kenworthy | ......... | H01L 21/68735 |
| | | | | 279/128 |
| 2010/0079742 A1 | 4/2010 | Kato et al. | | |
| 2010/0081355 A1* | 4/2010 | Inoue | ............. | H01J 9/241 |
| | | | | 445/24 |
| 2012/0070999 A1* | 3/2012 | Lindenberg | ............ | C23C 14/042 |
| | | | | 438/758 |
| 2012/0237682 A1* | 9/2012 | Hong | .................. | C23C 14/042 |
| | | | | 427/282 |
| 2014/0349428 A1* | 11/2014 | Han | .................. | H01L 51/56 |
| | | | | 438/34 |
| 2016/0144396 A1* | 5/2016 | Jang | .................. | C23C 14/042 |
| | | | | 118/505 |
| 2016/0248049 A1 | 8/2016 | Hong et al. | | |
| 2017/0162832 A1* | 6/2017 | Hahn | ................ | H01L 21/6831 |
| 2018/0040855 A1* | 2/2018 | Chen | .............. | C23C 14/042 |
| 2018/0053905 A1* | 2/2018 | Lee | ............... | H01L 51/0097 |
| 2018/0290168 A1* | 10/2018 | Han | .............. | C23C 16/45565 |
| 2019/0084105 A1 | 3/2019 | Kishimoto et al. | | |
| 2019/0386221 A1* | 12/2019 | Jang | .................. | H01L 51/56 |

FOREIGN PATENT DOCUMENTS

| | | | |
|---|---|---|---|
| KR | 10-2016-0062331 A | 6/2016 | |
| KR | 10-2016-0104194 A | 9/2016 | |
| KR | 10-1797927 B1 | 11/2017 | |
| KR | 10-1810683 B1 | 12/2017 | |
| WO | WO 2017/014172 A1 * | 1/2017 | ............. C23C 14/04 |

OTHER PUBLICATIONS

Grunwald, Rüediger, et al., "Microlens formation by thin-film deposition with mesh-shaped masks". Applied Optics, vol. 38, No. 19, Jul. 1, 1999, 4117-4124.*

Choi, Yu Min, et al., "Two-Color Pixel Patterning for High-Resolution Organic Light-Emitting Displays Using Photolithography". Micromachines, 2020, 11, 650, pp. 1-12. doi:10.3390/mi11070650.*

* cited by examiner

METHOD OF MANUFACTURING DISPLAY APPARATUS

CROSS-REFERENCE TO RELATED APPLICATION

This application claims priority to and the benefit of Korean Patent Application No. 10-2018-0134444, filed on Nov. 5, 2018, in the Korean Intellectual Property Office, the entire content of which is incorporated herein by reference.

BACKGROUND

1. Field

One or more embodiments relate to an apparatus and method, and for example, to a carrier, an apparatus for manufacturing a display apparatus and including the carrier, and a method of manufacturing a display apparatus.

2. Description of the Related Art

Mobile electronic devices are widely being used. For example, mobile electronic devices, including compact electronic devices such as mobile phones, tablet personal computers (PCs) have been widely used recently.

The mobile electronic devices may include a display apparatus to provide visual information such as images or pictures to a user to support diverse functions. Recently, as components for driving a display apparatus have become more compact, a ratio of the display apparatus in an electronic device is gradually increasing, and a display apparatus having a structure that is bendable at a set or predetermined angle from a flat state is also being developed.

SUMMARY

When a mask assembly is arranged inside a deposition unit in a manufacturing apparatus of a display apparatus according to the related art, it may take a long time and many processes to input a display substrate and the mask assembly into the deposition unit. In addition, according to a manufacturing apparatus for a display apparatus according to the related art, a chamber that is additionally provided is to be used to form various layers, and thus, the method and the apparatus itself are complicated, requiring a long time and high costs for maintenance of the manufacturing apparatus. One or more embodiments of the present disclosure include a carrier that is transported while a mask assembly and a display substrate are both attached to the carrier, an apparatus, including the carrier, for manufacturing a display apparatus, and a manufacturing method of a display apparatus. However, the above-referenced embodiments of the present disclosure are exemplary, and the scope of the present disclosure is not limited by the description above.

Additional aspects of embodiments will be set forth in part in the description which follows and, in part, will be apparent from the description, or may be learned by practice of the presented embodiments.

According to one or more embodiments, a carrier includes: a body portion; an electro permanent magnetic chuck arranged on a boundary portion of the body portion and configured to selectively fix a mask assembly; and a substrate fixing unit arranged in the body portion to selectively fix a display substrate.

The carrier may further include a magnetic force portion arranged in the body portion and configured to apply a magnetic force such that the mask assembly approaches the display substrate.

The carrier may further include a position varying portion coupled to the magnetic force portion and configured to vary a position of the magnetic force portion.

The magnetic force portion may include a permanent magnet.

The magnetic force portion may include a permanent and/or an electromagnet.

According to one or more embodiments, an apparatus for manufacturing a display apparatus, includes: a substrate loading unit; a mask loading unit coupled to the substrate loading unit; a deposition unit coupled to the mask loading unit and configured to deposit a deposition material on a display substrate; and a carrier configured to move to pass through the substrate loading unit, the mask loading unit, and the deposition unit, wherein the substrate loading unit is configured to have a display substrate fixed therein, and a mask assembly is fixed in the mask loading unit.

The carrier may include: a body portion; an electro permanent magnetic chuck arranged on a boundary portion of the body portion and configured to selectively fix the mask assembly; and a substrate fixing unit arranged in the body portion to selectively fix the display substrate.

The carrier may further include a magnetic force portion arranged in the body portion and configured to apply a magnetic force such that the mask assembly approaches the display substrate.

The carrier may further include a position varying portion coupled to the magnetic force portion and configured to vary a position of the magnetic force portion.

The magnetic force portion may include a permanent magnet and/or an electromagnet.

The mask loading unit may include a first switch unit that is configured to operate the electro permanent magnetic chuck through selective contact with the carrier.

The substrate loading unit may include a first vision unit configured to capture an image of positions of the display substrate and the carrier.

The mask loading unit may include a second vision unit configured to capture an image of at least one selected from positions of the display substrate and the mask assembly and positions of the carrier and the mask assembly.

The apparatus may further include a mask unloading chamber coupled to the deposition unit, wherein the mask assembly is configured to be separated from the carrier in the mask unloading chamber.

The apparatus may further include a substrate unloading chamber coupled to the mask unloading chamber, wherein the display substrate is configured to be separated from the carrier in the substrate unloading chamber.

According to one or more embodiments, a method of manufacturing a display apparatus, includes: sequentially fixing a display substrate and a mask assembly to a carrier; transporting the mask assembly and the display substrate to a deposition unit via the carrier; and depositing a deposition material on the display substrate by passing the deposition material through the mask assembly, by using the deposition unit.

The carrier may fix the mask assembly by using an electro permanent magnetic chuck.

The method may further include moving the mask assembly to approach the display substrate via a magnetic force.

The method may further include separating the mask assembly from the carrier.

The method may further include separating the display substrate from the carrier.

In addition to the aforesaid features, other aspects and features of embodiments of the disclosure will be further explained by the following drawings, claims, and detailed description.

These general and specific embodiments may be implemented by using a system, a method, a computer program, or a combination of the system, the method, and the computer program.

BRIEF DESCRIPTION OF THE DRAWINGS

These and/or other aspects of embodiments will become apparent and more readily appreciated from the following description of the embodiments, taken in conjunction with the accompanying drawings in which.

DETAILED DESCRIPTION

Figure 1:
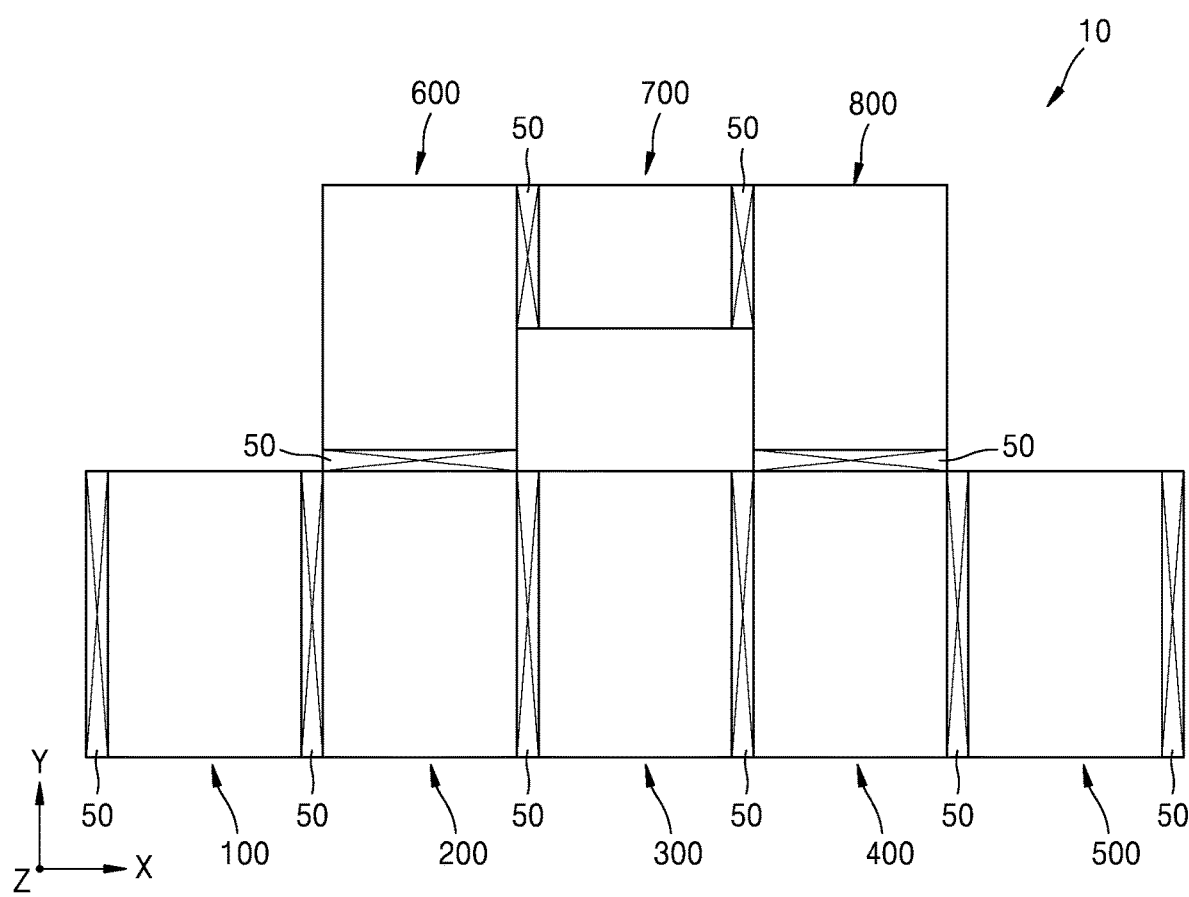
FIG. 1 is a plan view of an apparatus for manufacturing a display apparatus, according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of embodiments of the present description. As used herein, the term "and/or" includes any and all combinations of one or more of the associated listed items. Expressions such as "at least one of," when preceding a list of elements, modify the entire list of elements and do not modify the individual elements of the list.

Because the present disclosure may have various modifications and several embodiments, embodiments are shown in the drawings and will be described in more detail. Effects and features of embodiments of the present disclosure, and a method of achieving the same will be described with reference to the embodiments described below in more detail together with the attached drawings. However, the embodiments may have different forms and should not be construed as being limited to the descriptions set forth herein.

Hereinafter, the present disclosure will be described more fully with reference to the accompanying drawings, in which exemplary embodiments of the present disclosure are shown. In the drawings, like elements are labeled like reference numerals and repeated description thereof will be omitted.

While such terms as "first," "second," etc., may be used to describe various components, such components must not be limited to the above terms. The above terms are used only to distinguish one component from another.

An expression used in the singular encompasses the expression of the plural, unless it has a clearly different meaning in the context.

In the embodiments below, it will be further understood that the terms "comprise" and/or "have" used herein specify the presence of stated features or components, but do not preclude the presence or addition of one or more other features or components.

In the embodiments described herein below, it will be understood when a portion such as a layer, an area, or an element is referred to as being "on" or "above" another portion, it can be directly on or above the other portion, or an intervening portion may also be present.

Sizes of components in the drawings may be exaggerated or contracted for convenience of explanation. For example, because sizes and thicknesses of components in the drawings may be arbitrarily illustrated for convenience of explanation, the following embodiments are not limited thereto.

In the embodiments below, an x-axis, a y-axis, and a z-axis are not limited to three axes on a rectangular coordinates system but may be construed as including these axes. For example, an-x axis, a y-axis, and a z-axis may be at right angles or may also indicate different directions from one another, which are not at right angles.

When a certain embodiment may be implemented differently, a specific process order may be performed differently from the described order. For example, two consecutively described processes may be performed substantially at the same time (e.g., concurrently or simultaneously) or performed in an order opposite to the described order.

Figure 2:
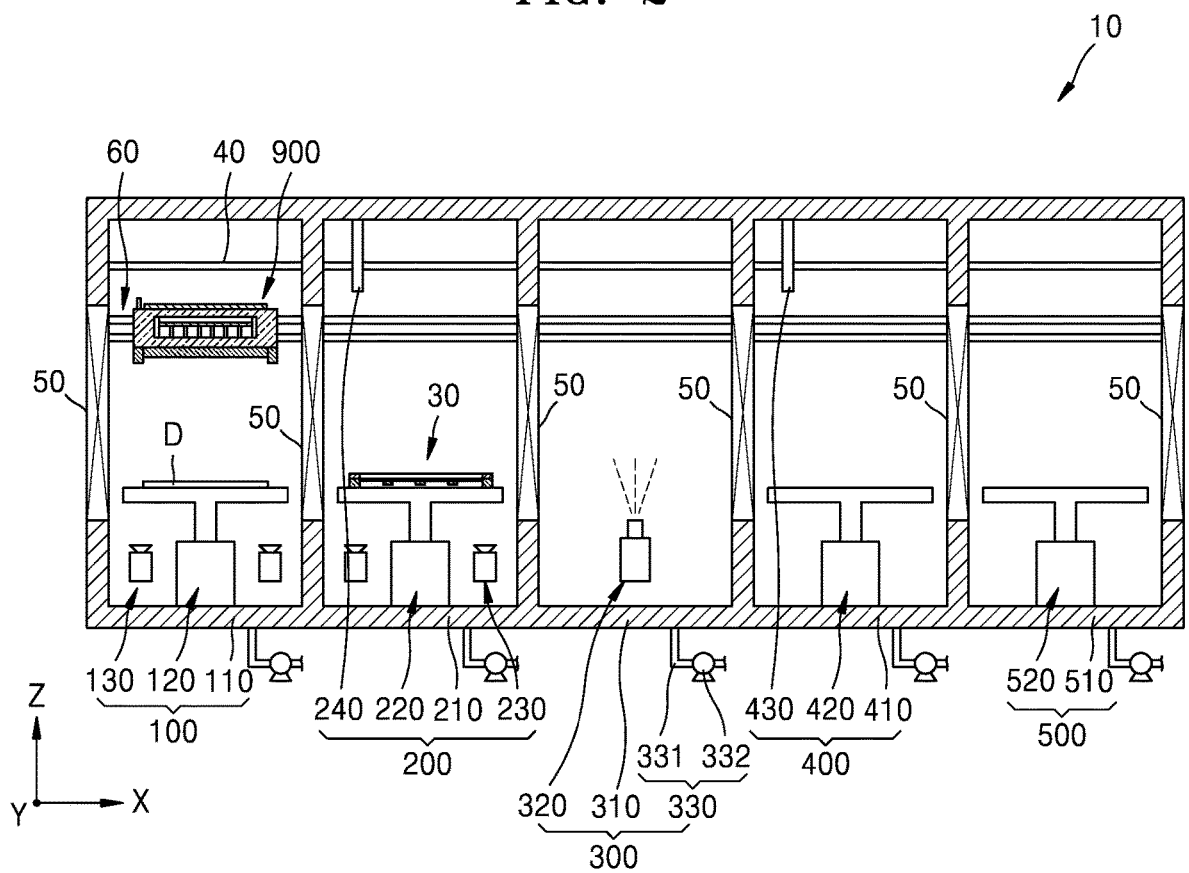
FIG. 2 is a cross-sectional view illustrating the apparatus for manufacturing a display apparatus, illustrated in FIG. 1.
Figure 3:
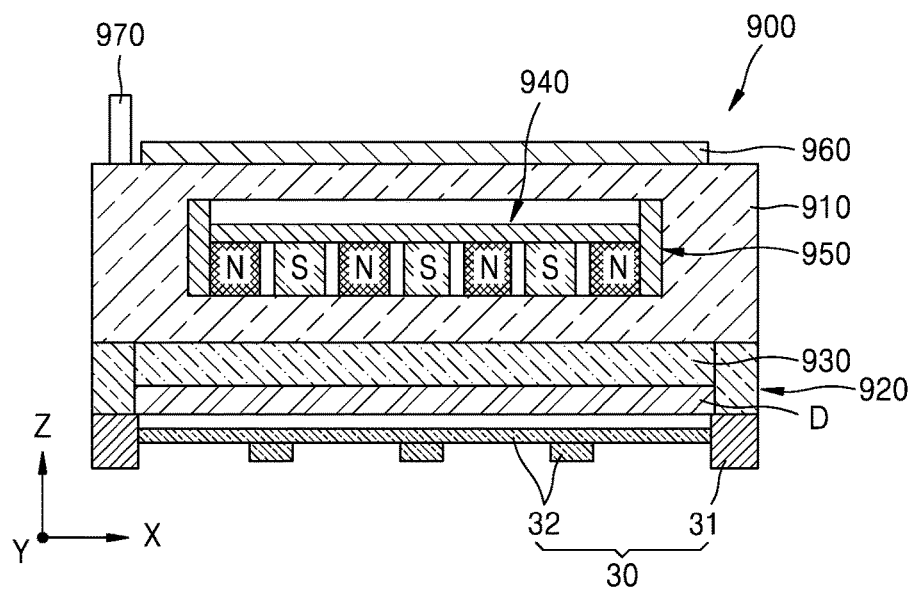
FIG. 3 is a cross-sectional view illustrating a carrier illustrated in FIG. 2, according to an embodiment.

FIG. 1 is a plan view of an apparatus 10 for manufacturing a display apparatus, according to an embodiment. FIG. 2 is a cross-sectional view illustrating the apparatus 10 for manufacturing a display apparatus, illustrated in FIG. 1. FIG. 3 is a cross-sectional view illustrating a carrier 900 illustrated in FIG. 2, according to an embodiment.

Referring to FIGS. 1-3, the apparatus 10 for manufacturing a display apparatus may include a substrate loading unit 100, a mask loading unit 200, a deposition unit 300, a mask unloading unit 400, a substrate unloading unit 500, a carrier 900, a carrier driver 60, a charging unit 40, a first mask storage unit 600, a moving unit 700, a second mask storage unit 800, and a controller.

The substrate loading unit 100, the mask loading unit 200, the deposition unit 300, the mask unloading unit 400, and the substrate unloading unit 500 may be coupled serially (for example, in an in-line form). The carrier 900 may sequentially move over the substrate loading unit 100, the mask loading unit 200, the deposition unit 300, the mask unloading unit 400, and the substrate unloading unit 500. In addition, a blocking portion 50 may be arranged in portions where the substrate loading unit 100, the mask loading unit 200, the deposition unit 300, the mask unloading unit 400, the substrate unloading unit 500, the first mask storage unit 600, the moving unit 700, and the second mask storage unit 800 are coupled to each other to separate the substrate loading unit 100, the mask loading unit 200, the deposition unit 300, the mask unloading unit 400, the substrate unloading unit 500, the first mask storage unit 600, the moving unit 700, and the second mask storage unit 800 from each other, thereby allowing independent operation of the above-described units. The blocking portion 50 may include, for example, a gate valve.

The substrate loading unit 100 may be a portion on which a display substrate D, which has been transported in from the outside, is seated. The substrate loading unit 100 may include a first chamber 110, in which a display substrate D is arranged, and a first substrate transporting unit 120, in which the display substrate D is seated and which moves the display substrate D to the carrier 900. The first substrate transporting unit 120 may be in various suitable forms such as a liftable cylinder, a robot arm that is movable in various suitable directions, etc. The substrate loading unit 100 may include a first vision unit 130 capturing an image of positions of the display substrate D and the carrier 900. The first vision unit 130 may capture an image of a position of an alignment mark of the display substrate D and an image of a position of an alignment mark of the carrier 900 (e.g., a portion of the carrier 900). The first substrate transporting unit 120 may vary a position of the display substrate D based on a result of image capturing of the first vision unit 130, or a position of the display substrate D may be varied after the display substrate D is fixed to the carrier 900. Hereinafter, for convenience of description, description of the display substrate D will focus on an embodiment in which the first substrate transporting unit 120 varies a position of the display substrate D, but the present disclosure is not limited thereto. In this case, the first substrate transporting unit 120 may include a UVW stage that finely (e.g., precisely or incrementally) moves a position of the display substrate D in at least two directions.

The mask loading unit 200 may supply a mask assembly 30 to the carrier 900. The mask loading unit 200 may include a second chamber 210, a first mask transporting unit 220, and a second vision unit 230. The second chamber 210 may have an inner space and may be coupled to the first chamber 110. In addition, the mask assembly 30, the first mask transporting unit 220, and the second vision unit 230 may be arranged inside the second chamber 210. The first mask transporting unit 220 and the second vision unit 230 are respectively identical to or similar to the first substrate transporting unit 120 and the first vision unit 130, as described above, and thus, duplicative description thereof will not be repeated here. For example, the second vision unit 230 may capture an image of a position of an alignment mark of the mask assembly 30 and an image of a position of an alignment mark of the display substrate D, or an image of a position of an alignment mark of the mask assembly 30 and an image of a position of an alignment mark of the carrier 900 (e.g., a set or particular portion thereof).

The mask loading unit 200 may include a first switch unit 240 that is arranged inside the second chamber 210 and is in selective contact with the carrier 900 according to movement of the carrier 900. When in contact with the carrier 900, the first switch unit 240 may operate a portion of the carrier 900. In this case, the first switch unit 240 may be in the form of a terminal and may be coupled to an external power supply (e.g., an ON/OFF controller). Operation of a portion of the carrier 900 to be described herein below may start as the portion of the carrier 900 comes into contact with the first switch unit 240.

The deposition unit 300 may include a third chamber 310, a deposition source 320 arranged in the third chamber 310 and accommodating a deposition material (e.g., the deposition source 320 includes the deposition material), and a pressure adjusting unit 330 coupled to the third chamber 310 to adjust a pressure in the third chamber 310.

The deposition source 320 may accommodate (e.g., include) various suitable deposition materials and may include, for example, a heater to vaporize or sublimate a deposition material in the deposition source 320. The deposition source 320 may be removably or replaceably arranged in the third chamber 310. For example, N deposition sources 320 (N is a natural number) accommodating identical or different deposition materials to supply the deposition materials into the third chamber 310 may be included. In this case, at least one of the N deposition sources 320 may be arranged in the third chamber 310, and the N deposition sources 320 may be exchangeable for each other. Hereinafter, for convenience of description, the following description will focus on an embodiment in which one deposition source 320 from among the N deposition sources 320 is arranged in the third chamber 310 when deposition is performed. In the above example, a deposition material is supplied from the one deposition source 320 into the third chamber 310 and deposited on the display substrate D, and then the deposition source 320 may be withdrawn out of the third chamber 310 and may no longer supply a deposition material. In addition, another deposition source 320 may enter the third chamber 310 to supply a new deposition material into the third chamber 310. In this case, a space where the deposition source 320 may be stored when not supplying deposition material may be provided inside or outside the third chamber 310.

Accordingly, the deposition unit 300 may sequentially deposit various suitable layers from the one third chamber 310 onto the display substrate D. In some embodiments, the deposition unit 300 may sequentially deposit, in the third chamber 310, layers that are commonly deposited in each pixel in a display apparatus, such as an intermediate layer, an opposite electrode, or the like, which will be described herein below.

The mask assembly 30 described above may have various suitable forms. For example, the mask assembly 30 may have a lattice shape and may have an opening in a center thereof, and the opening in the center thereof may be partitioned into a plurality of openings via, for example, ribs. As another embodiment, the mask assembly 30 may include a mask frame, a mask sheet, a support frame, and/or the like. The mask frame may have an opening in a center. The mask frame may not only support the mask sheet but may also define an entire (e.g., substantially an entire) area of the display substrate D that a deposition material reaches. The mask sheet may have various suitable forms. For example, the mask sheet may have a window frame shape. As another example, the mask sheet may have a slit shape, and also, a plurality of opening portions may be formed in a slit. According to another embodiment, the mask sheet may be an integral element, and an opening portion may be formed in a center portion of the mask sheet. The support frame may be arranged in an opened portion of the mask frame to partition the opened portion of the mask frame into a plurality of openings. The support frame may be arranged on each of a long side and a short side of the mask frame to cross each other. In this case, the support frame may define a deposition area in which a deposition material is deposited on the display substrate D, and the deposition area may correspond to a light-emitting area of a display apparatus to be described herein below. However, for convenience of description, the following description will focus on an embodiment in which the mask assembly 30 is formed as an integral element, and a support frame 32 is arranged in a lattice shape in a center portion of the mask frame 31, but the present disclosure is not limited thereto. Here, an alignment mark of the mask assembly 30 may be arranged on the mask frame 31.

The pressure adjusting unit 330 may include a connection pipe 331 coupled to the third chamber 310 and a pressure adjusting pump 332 arranged on the connection pipe 331 to absorb a gas of the connection pipe 331 to the outside or supply an external gas into the third chamber 310.

The mask unloading unit 400 may include a fourth chamber 410 coupled to the third chamber 310 and a second mask transporting unit 420 arranged in the fourth chamber 410. In addition, the mask unloading unit 400 may include a second switch unit 430 that is arranged inside the fourth chamber 410 and is in selective contact with the carrier 900 to input a signal to the carrier 900. The second mask transporting unit 420 and the second switch unit 430 are respectively similar to the first mask transporting unit 220 and the first switch unit 240 described above, and thus, duplicative description thereof will not be repeated here.

The substrate unloading unit 500 may include a fifth chamber 510 having an inner space, and a second substrate transporting unit 520 arranged inside the fifth chamber 510. The second substrate transporting unit 520 may be similar to the first substrate transporting unit 120 described above.

The carrier 900 may move through the substrate loading unit 100, the mask loading unit 200, the deposition unit 300, the mask unloading unit 400, and the substrate unloading unit 500. The carrier 900 may include a body portion 910, an electro permanent magnetic chuck 920, a substrate fixing portion 930, a magnetic force portion 940, a position varying portion 950, a charging module 960, and a terminal portion 970.

The body portion 910 may be in the form of a rigid body, and the electro permanent magnetic chuck 920, the substrate fixing portion 930, the magnetic force portion 940, the position varying portion 950, and the charging module 960 may be arranged in the body portion 910.

The electro permanent magnetic chuck 920 may be arranged to protrude from the body portion 910, and the mask assembly 30 may be selectively coupled to the electro permanent magnetic chuck 920. The electro permanent magnetic chuck 920 may include a permanent magnet and/or an electromagnet, and as a direction of a magnetic force is varied according to an external signal, a magnetic substance such as a metal may be attached to the electro permanent magnetic chuck 920. In this case, the mask assembly 30 may be formed of an Invar material, which is a magnetic substance (e.g., a ferromagnetic material).

The substrate fixing portion 930 may be in various suitable forms. For example, the substrate fixing portion 930 may include an electrostatic chuck. As another example, the substrate fixing portion 930 may be in the form of an adhesive chuck, a clamp, or the like. The substrate fixing portion 930 is not limited thereto and may include any suitable structure or apparatus that fixes the display substrate D by catching or attaching the display substrate D. The substrate fixing portion 930 may be arranged in a center portion of the body portion 910. An area of the substrate fixing portion 930 may be less than an area of the display substrate D. In this case, when the display substrate D is fixed to the substrate fixing portion 930, a boundary of the display substrate D may protrude from a boundary of the substrate fixing portion 930 toward an outer side of the substrate fixing portion 930. In addition, the electro permanent magnetic chuck 920 may be arranged on the boundary of the substrate fixing portion 930. The electro permanent magnetic chuck 920 may be arranged to completely surround the boundary of the substrate fixing portion 930 to form a closed circuit. As another example, a plurality of electro permanent magnetic chucks 920 may be included, and the plurality of electronic chucks 920 may also be arranged to be spaced apart from each other on the boundary of the substrate fixing portion 930.

The magnetic force portion 940 may provide a magnetic force to the mask assembly 30 to thereby push the mask assembly 30 toward the display substrate D. In this case, the magnetic force portion 940 may be in various suitable forms. For example, the magnetic force portion 940 may include a permanent magnet. As another example, the magnetic force portion 940 may include an electromagnet. Hereinafter, for convenience of description, the following description will focus on an embodiment in which the magnetic force portion 940 is a permanent magnet.

The position varying portion 950 may be coupled to the magnetic force portion 940 to vary a position of the magnetic force portion 940, thereby adjusting an intensity of a magnetic force applied by the magnetic force portion 940 to the mask assembly 30. The position varying portion 950 and the magnetic force portion 940 may be arranged inside the body portion 910. According to an embodiment, the position varying portion 950 may include a cylinder having a first end coupled to the body portion 910 and a second end arranged in the magnetic force portion 940 and a guide portion arranged in the body portion 910 and arranged such that the magnetic force portion 940 may make linear movement. The guide portion may include a linear motion guide. According to another embodiment, the position varying portion 950 may include a motor arranged in the body portion 910, a gear that is coupled to the motor and rotates in connection with the motor, and a rack gear that is coupled to the magnetic force portion 940 and makes linear movement according to rotation of the gear. According to another embodiment, the position varying portion 950 may include a linear motor coupling the magnetic force portion 940 to the body portion 910. The position varying portion 950 is not limited thereto and may include any suitable device or any suitable structure that is arranged between the body portion 910 and the magnetic force portion 940 to vary a position of the magnetic force portion 940.

The charging module 960 may include a contactless power supply (CPS) module, a power supply unit, and/or the like. Here, a CPS module may be a wireless charging module, and the power supply unit may include a device that stores electric energy (electricity) such as, for example, a secondary battery.

The terminal portion 970 may be arranged on the body portion 910. The terminal portion 970 may be in selective contact with the first switch unit 240 or the second switch unit 430 according to movement of the carrier 900. In this case, when the terminal portion 970 is in contact with the first switch unit 240, the electro permanent magnetic chuck 920 may operate, and when the terminal portion 970 is in contact with the second switch unit 430, operation of the electro permanent magnetic chuck 920 may be stopped. When the electro permanent magnetic chuck 920 operates, a direction of a magnetic force generated in a permanent magnet of the electro permanent magnetic chuck 920 may be changed toward the mask assembly 30 such that the mask assembly 30 is attached to the electro permanent magnetic chuck 920. Meanwhile, when operation of the electro permanent magnetic chuck 920 is stopped, a direction of a magnetic force generated in a permanent magnet of the electro permanent magnetic chuck 920 may be changed such that the mask assembly 30 is detached from the electro permanent magnetic chuck 920. The electro permanent magnetic chuck 920 may continuously operate for a period after the first switch unit 240 and the terminal portion 970 contact each other to operate and until the second switch unit 430 comes into contact with the terminal portion 970.

The carrier driver 60 may drive the carrier 900. For example, the carrier driver 60 may include a linear motor moving the carrier 900 by using, for example, a magnetic levitation method. According to another embodiment, the carrier driver 60 may also include a chain on which the carrier 900 is seated and to which the carrier 900 is coupled, a sprocket to which the chain is coupled, and a motor that rotates the sprocket. The carrier driver 60 is not limited to the above and may include any suitable device or any suitable structure that is coupled to the carrier 900 and reciprocally moves the carrier 900. According to another embodiment, the carrier driver 60 includes a coil-type rail, and a linear motion guide and/or the like may be arranged on a lateral surface of the body portion 910, and a magnetic body in which an N pole and an S pole are alternately arranged may be arranged on a surface of the body portion 910 facing the carrier driver 60. The carrier driver 60 is not limited to the above and may include any suitable device or any suitable structure that drives the carrier 900 by using one of a non-contact type method and a contact-type method. Hereinafter, for convenience of description, the following description will focus on an embodiment in which the carrier driver 60 includes a linear motor.

The charging unit 40 may be formed in the form of a charging track and may be arranged in first through fifth chambers 110 through 510. Arrangement of the charging unit 40 is not limited to the arrangement as illustrated in FIG. 2, and the charging unit 40 may also be arranged on an upper surface of the first through fifth chambers 110 through 510 to face the charging module 960.

The first mask storage unit 600 may include a first mask storage chamber coupled to the second chamber 210. In addition, the first mask storage unit 600 may include a first cassette arranged inside the first mask storage chamber and stores a plurality of mask assemblies 30. The first mask storage unit 600 may include a robot arm that is arranged inside the first mask storage chamber and transports the mask assembly 30 from the second chamber 210 to the first mask storage chamber.

The moving unit 700 may couple the first mask storage unit 600 to the second mask storage unit 800 and may transport the mask assembly 30 in one of the first mask storage unit 600 and the second mask storage unit 800 to the other of the first mask storage unit 600 and the second mask storage unit 800. The moving unit 700 may include, for example, a robot arm that may transport the mask assembly 30.

The second mask storage unit 800 may include a second mask storage chamber and a second cassette. The second mask storage chamber and the second cassette may be respectively identical or similar to the first mask storage chamber and the first cassette described above. The second mask storage unit 800 may also include a robot arm that moves the mask assembly 30.

In the above case, the first mask storage unit 600, the moving unit 700, and the second mask storage unit 800 may also be formed integrally (e.g., may be a single unit). The first mask storage unit 600, the moving unit 700, and the second mask storage unit 800 may include one chamber, at least one cassette arranged in the chamber, and a robot arm transporting the mask assembly 30, or the like. Hereinafter, for convenience of description, the following description will focus on an embodiment in which the first mask storage unit 600, the moving unit 700, and the second mask storage unit 800 are arranged separately as described above.

The controller may control operation of the apparatus 10 for manufacturing a display apparatus. The controller may be in the form of a circuit display substrate. As another example, the controller may include, for example, a computer, a laptop computer, a mobile phone, and/or a portable terminal.

In some embodiments, the apparatus 10 for manufacturing a display apparatus may further include a pressure adjusting unit that is coupled to at least one selected from the substrate loading unit 100, the mask loading unit 200, the mask unloading unit 400, the substrate unloading unit 500, the first mask storage unit 600, the moving unit 700, and the second mask storage unit 800, and the pressure adjusting unit adjusts a pressure in each chamber. The pressure adjusting unit may be identical or similar to the pressure adjusting unit 330 described herein above.

Meanwhile, when manufacturing a display apparatus by using the apparatus 10 for manufacturing a display apparatus, first, the display substrate D may be supplied to the first chamber 110. The display substrate D may be inserted into the first chamber 110 via a robot arm or the like outside the first chamber 110. In the display substrate D, various suitable layers may be formed. Hereinafter, for convenience of description, the following description will focus on an embodiment in which the display substrate D includes a substrate and a thin film transistor, and a pixel electrode and some layers of an intermediate layer.

The display substrate D may be seated on the first substrate transporting unit 120 inside the first chamber 110. Here, the first substrate transporting unit 120 may be lifted to fix the display substrate D to the substrate fixing portion 930. In this case, the first vision unit 130 may capture images of an alignment mark of the display substrate D and an alignment mark of the carrier 900, and the controller may determine respective positions of the carrier 900 and the display substrate D based on a result of image capturing of the first vision unit 130 to align the display substrate D with the carrier 900.

When the display substrate D is fixed to the carrier 900 as described above, the carrier 900 may be moved from the first chamber 110 to the second chamber 210. While the carrier 900 is being moved or when the carrier 900 is stopped at the second chamber 210, the terminal portion 970 and the first switch unit 240 may contact each other and the electro permanent magnetic chuck 920 may operate.

In the above case, the second vision unit 230 may capture an image of one of the mask assembly 30 and the carrier 900 or one of the mask assembly 30 and the display substrate D, and the controller may vary a position of at least one selected from the mask assembly 30 and the carrier 900 based on the captured image to thereby align the mask assembly 30 with the display substrate D. Next, when the first mask transporting unit 220 provides the mask assembly 30 to the electro permanent magnetic chuck 920, the electro permanent magnetic chuck 920 may attach the mask assembly 30. Here, the first mask storage unit 600 may supply the mask assembly 30 to the second chamber 210.

The carrier 900 may be moved from the second chamber 210 to the third chamber 310. Here, the contact between the terminal portion 970 and the first switch unit 240 may be released. However, as described above, as the electro permanent magnetic chuck 920 operates continuously (e.g., substantially continuously), the mask assembly 30 may be fixed.

When the carrier 900 arrives at the third chamber 310, the deposition source 320 may operate to supply a deposition material to the display substrate D, and the deposition material may pass through the mask assembly 30 to be deposited on the display substrate D.

In this case, each of a plurality of deposition sources 320 accommodating different deposition materials may be arranged sequentially in the third chamber 310 to deposit different layers on the display substrate D. For example, the plurality of deposition sources 320 may respectively include deposition materials that are different from one another. Here, the arrangement of the deposition sources 320 may be one in which the deposition sources 320 accommodating different deposition materials are replaced with each other.

As described above, a plurality of layers may be sequentially stacked on the display substrate D. When deposition of a plurality of layers is completed, the carrier 900 may transport the display substrate D and the mask assembly 30 from the third chamber 310 to the fourth chamber 410.

While the carrier 900 is arriving at the fourth chamber 410 or has arrived at the fourth chamber 410, the terminal portion 970 may contact the second switch unit 430. The second mask transporting unit 420 may move linearly to be in contact with the mask assembly 30.

When the terminal portion 970 and the second switch unit 430 are in contact with each other, an OFF signal may be input to the electro permanent magnetic chuck 920. In this case, a direction of a magnetic force of the electro permanent magnetic chuck 920 proceeding to the mask assembly 30 is varied, and the mask assembly 30 and the electro permanent magnetic chuck 920 may be separated from each other accordingly.

When the mask assembly 30 is separated from the electro permanent magnetic chuck 920, the mask assembly 30 may be transported to the second mask storage unit 800. Next, the mask assembly 30 may be transported to the first mask storage unit 600 via the moving unit 700 to be stored in the first mask storage unit 600.

Meanwhile, when the carrier 900 is transported from the fourth chamber 410 to the fifth chamber 510, the display substrate D may be seated on the second substrate transporting unit 520. Here, the carrier 900 may include an additional structure to separate the display substrate D from the substrate fixing portion 930, or when the substrate fixing portion 930 is an electrostatic chuck, the carrier 900 may remove an electrostatic force formed in the substrate fixing portion 930.

When the above-described process is completed, the carrier 900 may return to its initial position. In addition, the display substrate D on which a plurality of layers are formed may be transported in the fifth chamber 510 via a robot arm or the like, to an additional apparatus for forming other layers or to an apparatus coupled to the apparatus 10 for manufacturing a display substrate D according to embodiments of the present disclosure, and other layers may be formed on the display substrate D, and the display substrate D may be manufactured to the display apparatus in this manner.

In addition, while the above-described process is performed, when the blocking portion 50 between chambers coupled to each other during movement of the carrier 900 is opened, an internal pressure of the chambers coupled to each other may be maintained equally. In this case, each pressure adjusting unit may operate to adjust a pressure of each chamber.

Moreover, while the above-described process is performed, the magnetic force portion 940 may provide a magnetic force to the mask assembly 30 to thereby closely adhere the mask assembly 30 to the display substrate D. The magnetic force that closely adheres the mask assembly 30 to the display substrate D may be varied by adjusting a distance between the magnetic force portion 940 and the mask assembly 30 by using the position varying portion 950. Here, in the carrier 900, a distance measurement unit that measures a distance between an upper surface of the mask assembly 30 and a lower surface of the carrier 900 may also be additionally included.

Accordingly, according to embodiments of the carrier 900, the apparatus 10 for manufacturing a display apparatus, and the method of manufacturing a display apparatus, the mask assembly 30 and the display apparatus may be fixed and aligned via the carrier 900 and a deposition process may be performed in this state, and thus, a deposition operation may be simplified and performed quickly.

In addition, according to embodiments of the carrier 900, the apparatus 10 for manufacturing a display apparatus, and the method of manufacturing a display apparatus, as the mask assembly 30 is fixed by using the electro permanent magnetic chuck 920, a variation in a position of the mask assembly 30 during movement of the mask assembly 30 may be prevented or reduced.

According to embodiments of the carrier 900, the apparatus 10 for manufacturing a display apparatus, and the method of manufacturing a display apparatus, as there is no additional structure or instrument for fixing the mask assembly 30 in a chamber, the mask assembly 30 may be directly withdrawn to the outside and cleaned.

According to embodiments of the carrier 900, the apparatus 10 for manufacturing a display apparatus, and the method of manufacturing a display apparatus, a deposition material may be accurately deposited in a pattern on the display substrate D by closely adhering the mask assembly 30 and the display apparatus D to each other as much as possible.

Figure 4:
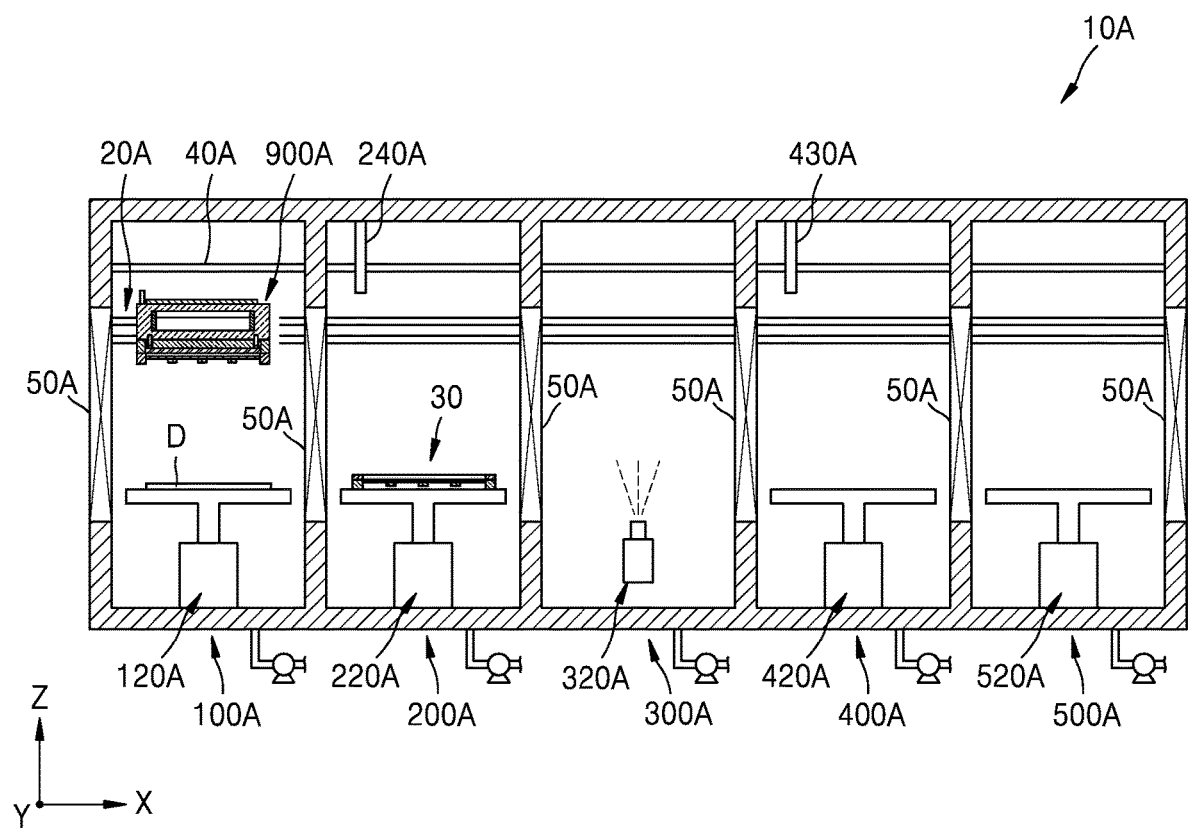
FIG. 4 is a cross-sectional view of an apparatus for manufacturing a display apparatus, according to another embodiment.
Figure 5:
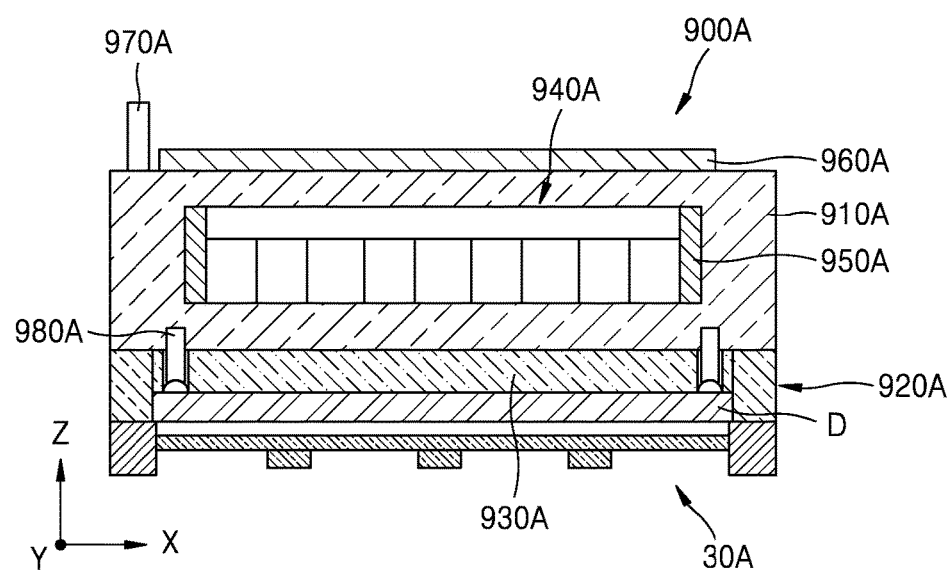
FIG. 5 is a cross-sectional view illustrating a carrier illustrated in FIG. 4.

FIG. 4 is a cross-sectional view of an apparatus 10A for manufacturing a display apparatus, according to another embodiment. FIG. 5 is a cross-sectional view illustrating a carrier 900A illustrated in FIG. 4.

Referring to FIGS. 4 and 5, the apparatus 10A for manufacturing a display apparatus may include a substrate loading unit 100A, a mask loading unit 200A, a deposition unit 300A, a mask unloading unit 400A, a substrate unloading unit 500A, a carrier 900A, a carrier driver 60A, a charging unit 40A, a mask storage unit, and a controller. A blocking portion 50A may be arranged between the substrate loading unit 100A, the mask loading unit 200A, the deposition unit 300A, the mask unloading unit 400A, the substrate unloading unit 500A, and the mask storage unit and selectively couple or block space of each chamber. The substrate loading unit 100A, the mask loading unit 200A, the deposition unit 300A, the mask unloading unit 400A, the substrate unloading unit 500A, the carrier driver 60A, the charging unit 40A, and the controller are identical or similar to those described above with reference to FIGS. 1-3, and thus, duplicative description thereof will not be repeated here. For example, the mask storage unit may have a form in which the first mask storage unit 600, the moving unit 700, and the second mask storage unit 800 described above with reference to FIGS. 1-3 are integrally formed (e.g., may be a single unit).

In the above case, according to an embodiment, a vision unit 980A may be arranged on each of the substrate loading unit 100A and the mask loading unit 200A as described above with reference to FIGS. 1-3. As another example, the vision unit 980A may also be arranged on a body portion 910A of the carrier 900A, which will be described herein below. Hereinafter, for convenience of description, the following description will focus on an embodiment in which the vision unit 980A is arranged on the body portion 910A.

The carrier 900A may move through the substrate loading unit 100A, the mask loading unit 200A, the deposition unit 300A, the mask unloading unit 400A, and the substrate unloading unit 500A. The carrier 900A may include a body portion 910A, an electro permanent magnetic chuck 920A, a substrate fixing unit 930A, a magnetic force portion 940A, a position varying portion 950A, a charging module 960A, a terminal portion 970A, and the vision unit 980A. The body portion 910A, the electro permanent magnetic chuck 920A, the substrate fixing unit 930A, the position varying portion 950A, the charging module 960A, and the terminal portion 970A may be respectively formed in an identical or similar manner to corresponding elements described above with reference to FIGS. 1-3, and thus, duplicative description thereof will not be repeated here.

The magnetic force portion 940A may also be in the form of an electro permanent magnetic chuck like the electro permanent magnetic chuck 920A. In this case, the magnetic force portion 940A may operate when the terminal portion 970A is in contact with the first switch unit 240A, and operation of the magnetic force portion 940A may be stopped when the terminal portion 970A is in contact with the second switch unit 430A.

In regard to operation of the apparatus 10A for manufacturing a display apparatus, the carrier 900A may pick up a display substrate D from the substrate loading unit 100A. The vision unit 980A may capture an image of a position of the display substrate D, and the controller may align the display substrate D with the carrier 900A based on the position of the display substrate D and a preset position of the display substrate D.

The carrier 900A may pick up a mask assembly 30A from the mask loading unit 200A. In more detail, the vision unit 980A may capture an image of a position of the mask assembly 30A or an image of a position of the mask assembly 30A and an image of a position of the display substrate D and transmit the images to the controller. The controller may align the positions of the mask assembly 30A and the display substrate D based on a result of the image capture of the vision unit 980A.

Position alignment of the display substrate D and the mask assembly 30A as described above may be respectively performed by using a first substrate transporting unit 120A of the substrate loading unit 100A and a first mask transporting unit 220A of the mask loading unit 200A as described above with reference to FIGS. 1-3. According to another embodiment, an additional driver may be coupled to the substrate fixing unit 930A, to which the display substrate D is attached, and the electro permanent magnetic chuck 920A, to which the mask assembly 30A is attached, to thereby independently adjust a position of the display substrate D and a position of the mask assembly 30A.

Here, the terminal portion 970A may contact the first switch unit 240A. When the terminal portion 970A is in contact with the first switch unit 240A, the electro permanent magnetic chuck 920A may operate to attach the mask assembly 30A to the electro permanent magnetic chuck 920A, and the magnetic force portion 940A may operate to make the mask assembly 30A approach the display substrate D. Here, the position varying portion 950A may vary a position of the magnetic force portion 940A to adjust a distance between the mask assembly 30A and the display substrate D. A plurality of terminal portions 970A and a plurality of first switch units 240A may be included such that they correspond to each other, and the plurality of terminal portions 970A may be arranged at different positions from each other such that the above-described operation is sequentially performed. For example, after the electro permanent magnetic chuck 920A operates such that the mask assembly 30A is attached to the electro permanent magnetic chuck 920A, the magnetic force portion 940A may operate to make the mask assembly 30A approach the display substrate D.

The carrier 900A, to which the display substrate D and the mask assembly 30A are fixed, is moved from the mask loading unit 200A to the deposition unit 300A, and the deposition source 320A of the deposition unit 300A may deposit a deposition material on the display substrate D.

Next, when deposition is completed, the carrier 900A may be moved to the mask unloading unit 400A. Here, the terminal portion 970A may contact the second switch unit 430A to stop operation of the electro permanent magnetic chuck 920A and the magnetic force portion 940A. In this case, the mask assembly 30A may be separated from the electro permanent magnetic chuck 920A. In addition, the second mask transporting unit 420A may support the mask assembly 30A that is separated from the electro permanent magnetic chuck 920A.

The mask assembly 30A separated as described above may be transported from the mask unloading unit 400A to the mask storage unit to be stored and may be supplied from the mask storage unit to the mask loading unit 200A as necessary or desired.

After the mask assembly 30A is separated from the carrier 900A, the carrier 900A may be moved from the mask unloading unit 400A to the substrate unloading unit 500A. Next, the display substrate D may be separated from the substrate fixing unit 930A, and the display substrate D that is separated may be supported by the second substrate transporting unit 520A. The display substrate D that is separated may be withdrawn out of the second substrate transporting unit 520A, and the carrier 900A may return to the substrate loading unit 100A.

During the above-described process, the carrier 900A may continuously (e.g., substantially continuously) receive electric energy in a wireless manner through the charging unit 40A.

Accordingly, according to embodiments of the carrier 900A, the apparatus 10A for manufacturing a display apparatus, and the method of manufacturing a display apparatus, the mask assembly 30A and the display apparatus may be fixed and aligned by using the carrier 900, and a deposition process may be performed in this state, and thus, a deposition process may be simplified and performed quickly.

In addition, according to embodiments of the carrier 900A, the apparatus 10A for manufacturing a display apparatus, and the method of manufacturing a display apparatus, as the mask assembly 30A is fixed by using the electro permanent magnetic chuck 920A, a variation in a position of the mask assembly 30A during movement of the mask assembly 30A may be prevented or reduced.

According to embodiments of the carrier 900A, the apparatus 10A for manufacturing a display apparatus, and the method of manufacturing a display apparatus, as there is no additional structure or instrument for fixing the mask assembly 30A in a chamber, the mask assembly 30A may be directly withdrawn to the outside and cleaned.

According to embodiments of the carrier 900A, the apparatus 10A for manufacturing a display apparatus, and the method of manufacturing a display apparatus, as the mask assembly 30A and the display apparatus are closely adhered to each other as much as is practical or possible, a deposition material may be accurately deposited in a pattern on the display substrate D.

Figure 6:
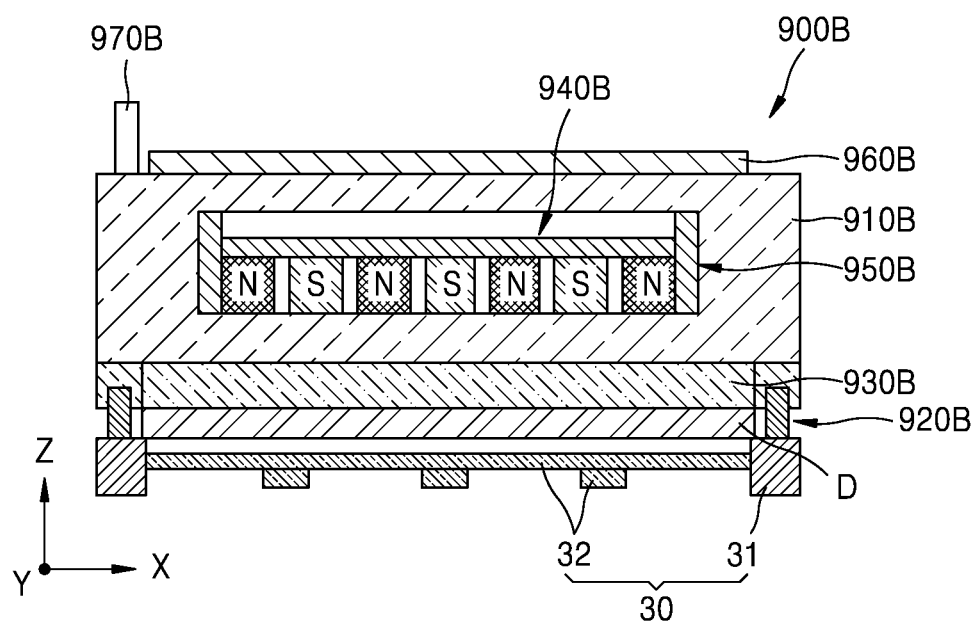
FIG. 6 is a cross-sectional view of a carrier of a display apparatus according to another embodiment.
Figure 7:
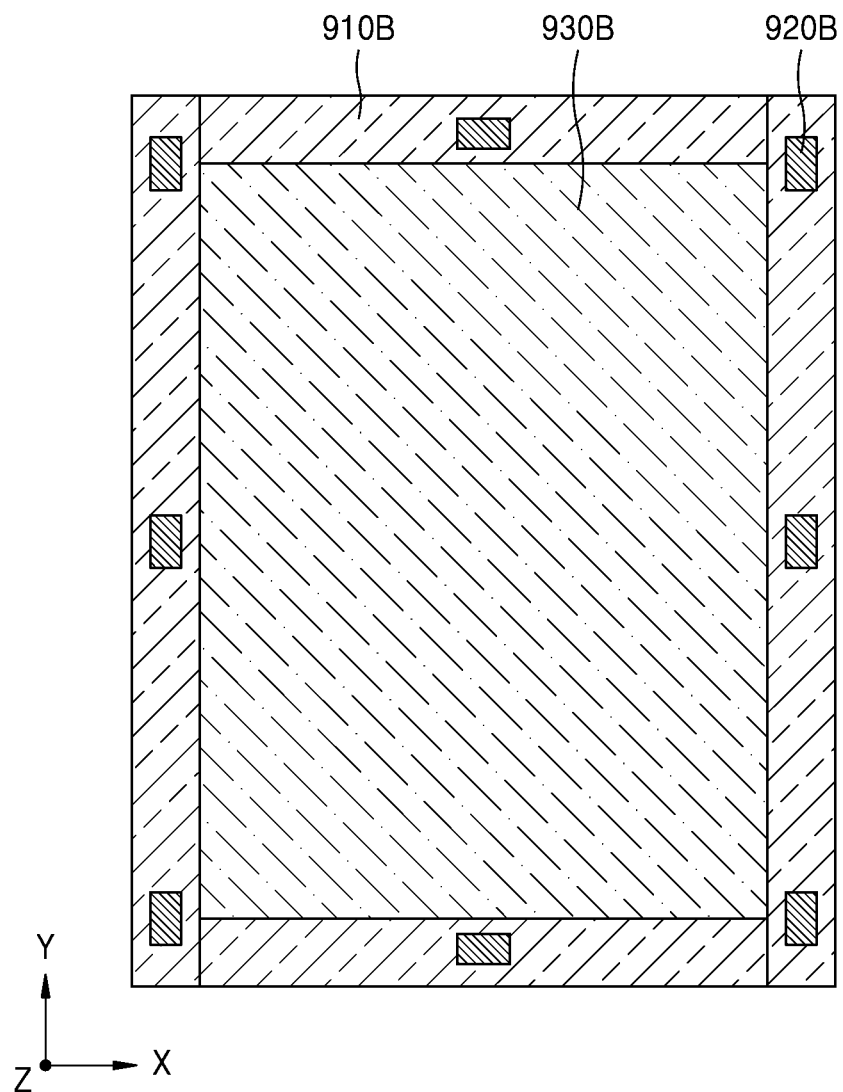
FIG. 7 is a rear view of the carrier illustrated in FIG. 6.

FIG. 6 is a cross-sectional view of a carrier of a display apparatus according to another embodiment. FIG. 7 is a rear view of the carrier illustrated in FIG. 6.

Referring to FIGS. 6 and 7, an apparatus (not shown) for manufacturing a display apparatus may be identical to or similar to the apparatus 10 for manufacturing a display apparatus, illustrated in FIG. 1 or the apparatus 10A for manufacturing a display apparatus, illustrated in FIG. 4. The apparatus for manufacturing a display apparatus may include a carrier 900B.

Similar to FIG. 3, the carrier 900B may include a body portion 910B, an electro permanent magnetic chuck 920B, a substrate fixing portion 930B, a magnetic force portion 940B, a position varying portion 950B, a charging module 960B, and a terminal portion 970B. According to another embodiment, the carrier 900B may also include a vision portion (not shown) as illustrated in FIG. 5, in addition to the above-described components.

A plurality of the electro permanent magnetic chucks 920B may be provided in a boundary of the body portion 910B. The plurality of electro permanent magnetic chucks 920B may be arranged to surround a center portion of the body portion 910B. The substrate supporting portion 930B may be arranged on the center portion of the body portion 910B. In particular, the plurality of the electro permanent magnetic chucks 920B may be spaced apart from each other along a boundary of the substrate supporting portion 930B.

By using the electro permanent magnetic chucks 920B, the mask assembly 30 may be selectively attached to the electro permanent magnetic chucks 920B as described above. The mask assembly 30 may include the mask frame 31 as described above. Also, the mask assembly 30 may include at least one of a mask sheet (not shown) arranged on the mask frame 31 and a support frame 32. In this case, as a magnetic force is applied to the mask frame 31 via each of the electro permanent magnetic chucks 920B, the mask frame 31 may be selectively attached to the electro permanent magnetic chucks 920B.

Meanwhile, a display apparatus (not shown) may be manufactured by using the apparatus for manufacturing a display apparatus in a similar manner as described with reference to FIGS. 1 through 3 or FIGS. 4 and 5.

In the above case, the mask assembly 30 may be attached to the carrier 900B by using the electro permanent magnetic chucks 920B or the mask assembly 30 may be separated from the electro permanent magnetic chucks 920B.

Figure 8:
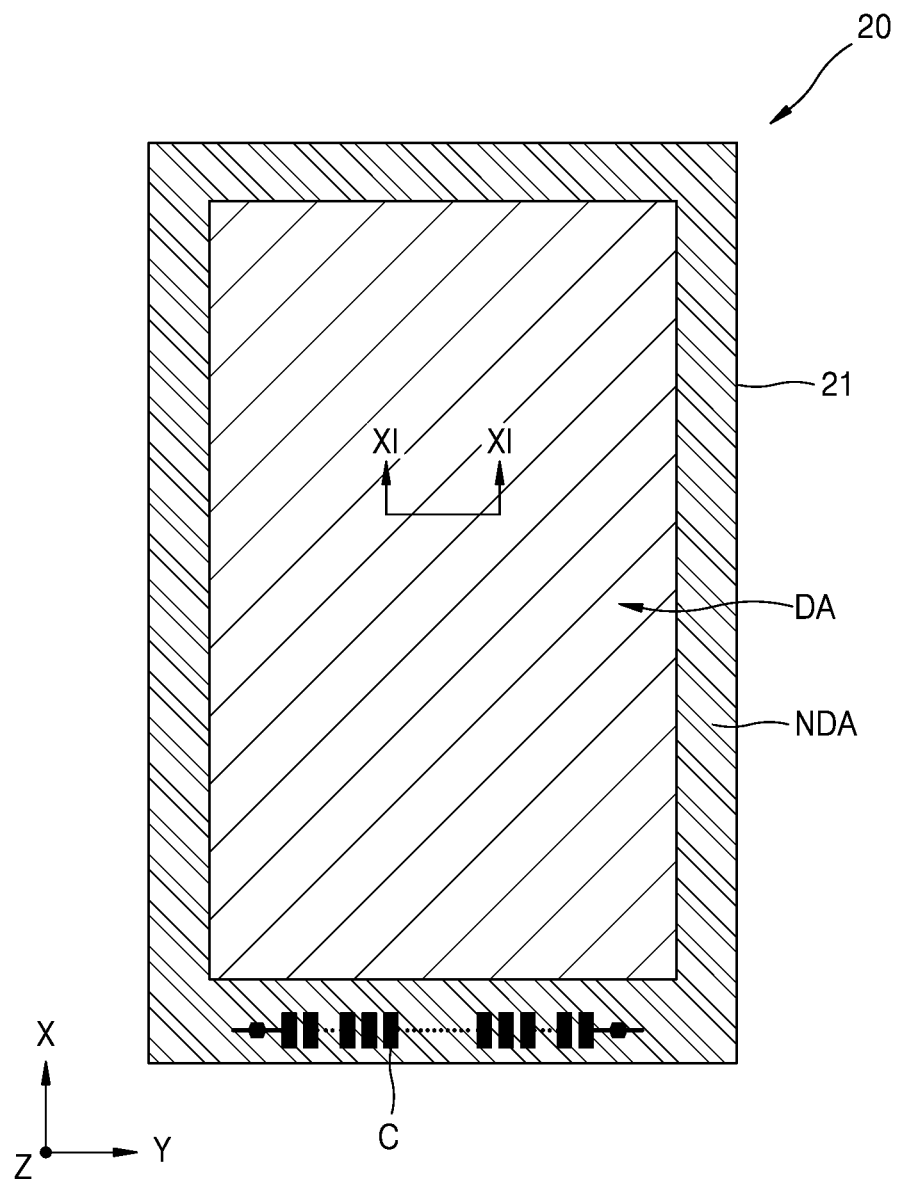
FIG. 8 is a plan view illustrating a display apparatus manufactured by using the apparatus for manufacturing a display apparatus, illustrated in FIG. 1.
Figure 9:
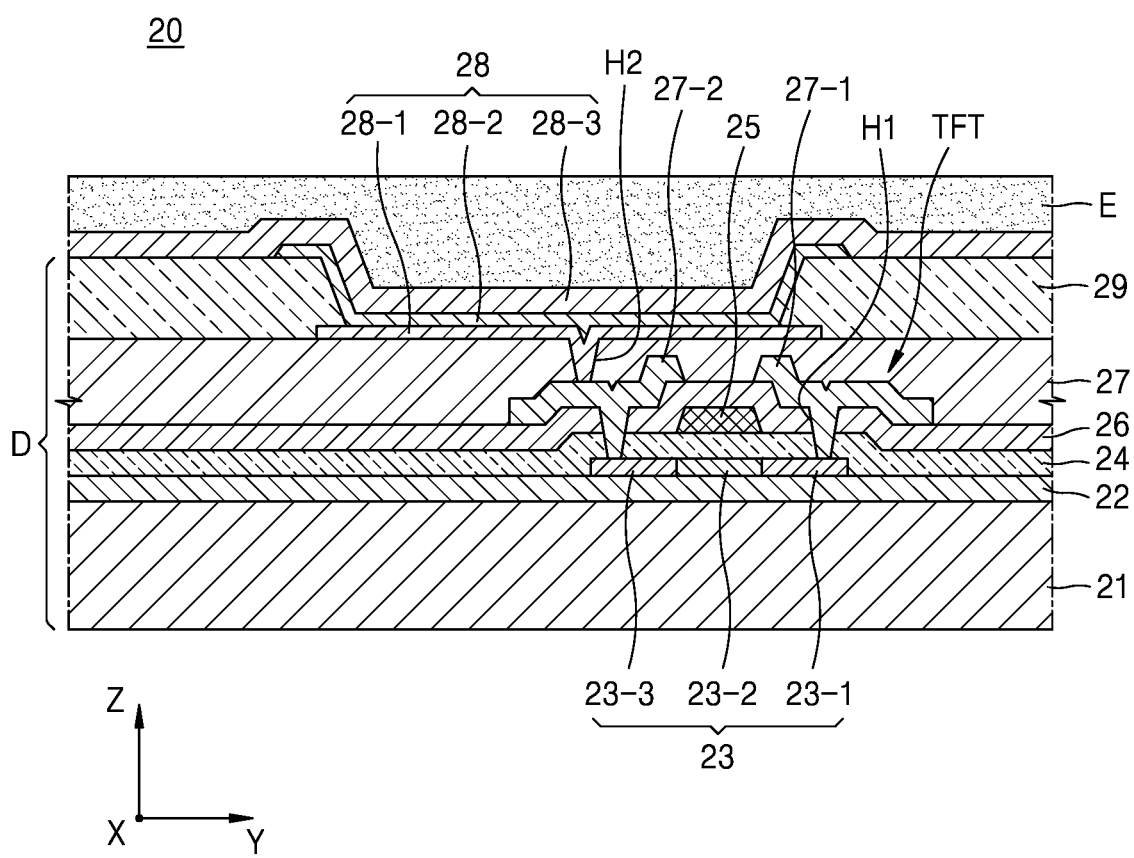
FIG. 9 is a cross-sectional view of a portion of the display apparatus taken along line XI-XI of FIG. 8.

FIG. 8 is a plan view illustrating a display apparatus 20 manufactured by using the apparatus 10 for manufacturing a display apparatus illustrated in FIG. 1. FIG. 9 is a cross-sectional view of a portion of the display apparatus taken along line XI-XI of FIG. 8.

Referring to FIGS. 8 and 9, in the display apparatus 20, a display area DA may be defined on a substrate 21, and a non-display area NDA may be defined in an outer portion of the display area DA. A light-emitting portion may be arranged in the display area DA, and a power supply wiring may be arranged in the non-display area NDA. In addition, a pad portion C may be arranged in the non-display area NDA.

The display apparatus 20 may include a display substrate D and a thin film encapsulation layer E. The display substrate D may include the substrate 21, a thin film transistor TFT, a passivation layer 27, and a pixel electrode 28-1. According to another embodiment, the display substrate D may include some of the substrate 21, the thin film transistor TFT, the passivation layer 27, the pixel electrode 28-1, and some layers of an intermediate layer 28-2. According to another embodiment, the display substrate D may include the substrate 21, the thin film transistor TFT, the passivation layer 27, the pixel electrode 28-1, and the intermediate layer 28-2. Hereinafter, for convenience of description, the following description will focus on an embodiment in which the display substrate D includes the substrate 21, the thin film transistor TFT, the passivation layer 27, and the pixel electrode 28-1.

The substrate 21 may include a plastic material, or a metal such as a SUS (Stainless steel) or Ti. In addition, the substrate 21 may include a polyimide (PI). Hereinafter, for convenience of description, the following description will focus on an embodiment in which the substrate 21 is formed of PI.

The thin film transistor TFT may be formed on the substrate 21, and the passivation layer 27 covering the thin film transistor TFT may be formed, and an organic light-emitting device 28 may be formed on the passivation layer 27.

A buffer layer 22 formed of an organic compound and/or an inorganic compound is further formed on an upper surface of the substrate 21, for example, the buffer layer may include SiOx (x≥1) or SiNx (x≥1).

After an active layer 23 arranged in a set or certain pattern is formed on the buffer layer 22, the active layer 23 is buried by a gate insulating layer 24. The active layer 23 includes a source area 23-1, a drain area 23-3, and a channel area 23-2 therebetween.

The active layer 23 may include various suitable materials. For example, the active layer 23 may include an inorganic semiconductor material such as an amorphous silicon and/or a crystalline silicon. As another example, the active layer 23 may include an oxide semiconductor. As another example, the active layer 23 may include an organic semiconductor material. However, for convenience of description, the following description will focus on an embodiment in which the active layer 23 is formed of an amorphous silicon.

The active layer 23 may be formed by forming an amorphous silicon layer on the buffer layer 22, crystallizing the amorphous silicon layer to form a polycrystalline silicon layer, and patterning the polycrystalline silicon layer. The source area 23-1 and the drain area 23-3 of the active layer 23 are doped with an impurity according to a TFT type such as a driving TFT, a switching TFT, and/or the like.

A gate electrode 25 corresponding to the active layer 23, and an interlayer insulating layer 26 burying the gate electrode 25 are formed on an upper surface of the gate insulating layer 24.

In addition, a contact hole H1 is formed in the interlayer insulating layer 26 and the gate insulating layer 24, and then a source electrode 27-1 and a drain electrode 27-2 are formed on the interlayer insulating layer 26 to respectively contact the source area 23-1 and the drain area 23-3.

The passivation layer 27 is formed on the thin film transistor TFT formed as described above, and the pixel electrode 28-1 of the organic light-emitting device 28 (OLED) is formed on the passivation layer 27. The pixel electrode 28-1 contacts the drain electrode 27-2 of the thin film transistor TFT through a via hole H2 formed in the passivation layer 27. The passivation layer 27 may be formed of an inorganic material and/or an organic material, as a single layer or two or more layers. The passivation layer 27 may be formed as a planarization layer such that an upper surface thereof is flat regardless of curves of a lower layer of the passivation layer 27, or may also be curved according to curves in a lower layer included in the passivation layer 27. The passivation layer 27 may preferably be formed of a transparent insulator to achieve resonance effects.

After forming the pixel electrode 28-1 on the passivation layer 27, a pixel defining layer 29 covering the pixel electrode 28-1 and the passivation layer 27 may be formed of an organic material and/or an inorganic material and is opened such that the pixel electrode 28-1 is exposed.

In addition, an intermediate layer 28-2 and an opposite electrode 28-3 are formed at least on the pixel electrode 28-1. According to another embodiment, the opposite electrode 28-3 may also be formed on the entire (e.g., substantially the entire) surface of the display substrate D. In this case, the opposite electrode 28-3 may be formed on the intermediate layer 28-2 and the pixel defining layer 29. Hereinafter, for convenience of description, the following description will focus on an embodiment in which the opposite electrode 28-3 is formed on the intermediate layer 28-2 and the pixel defining layer 29.

The pixel electrode 28-1 may function as an anode electrode, and the opposite electrode 28-3 may function as a cathode electrode. Polarities of the pixel electrode 28-1 and the opposite electrode 28-3 may also be exchanged.

The pixel electrode 28-1 and the opposite electrode 28-3 are insulated from each other via the intermediate layer 28-2, and voltages of different polarities are applied to the intermediate layer 28-2 such that light is emitted from an organic emission layer.

The intermediate layer 28-2 may include an organic emission layer. According to another selective embodiment, the intermediate layer 28-2 may include an organic emission layer, and may further include at least one of a hole injection layer, a hole transport layer, an electron transport layer, and an electron injection layer. The present embodiment is not limited thereto, and the intermediate layer 28-2 may include an organic emission layer and other various suitable functional layers.

A plurality of intermediate layers 28-2 as described above may be included, and the plurality of intermediate layers 28-2 may form the display area DA. The plurality of intermediate layers 28-2 may be spaced apart from each other in the display area DA.

A unit pixel includes a plurality of sub-pixels, and the plurality of sub-pixels may emit light of various suitable colors. For example, the plurality of sub-pixels may respectively include a sub-pixel configured to emit light of a red color, a sub-pixel configured to emit a green color, and a sub-pixel configured to emit a blue color, or a sub-pixel configured to emit light of a red color, a sub-pixel configured to emit a green color, a sub-pixel configured to emit a blue color, and a sub-pixel configured to emit a white color.

According to the embodiments of the apparatus for manufacturing a display apparatus illustrated in FIG. 1 or FIG. 4, various suitable layers may be formed on the display substrate D. For example, the apparatus for manufacturing a display apparatus may be used to form at least one of the intermediate layers 28-2 on the display substrate D, and the opposite electrode 28-3 and at least one layer of the thin film encapsulation layer E. For example, according to embodiments of the apparatus for manufacturing a display apparatus, at least one selected from an organic emission layer, a hole injection layer, a hole transport layer, an electron injection layer, an electronic transport layer, and a functional layer from among the intermediate layers 28-2 may be formed. In some embodiments, when the apparatus for manufacturing a display apparatus forms at least one of the intermediate layers 28-2 on the display substrate D, the apparatus may manufacture one layer by using a plurality of deposition materials or a plurality of layers at the same time (e.g., concurrently or simultaneously). In addition, when the apparatus for manufacturing a display apparatus forms an organic emission layer from among the intermediate layer 28-2 on the display substrate D, the apparatus may sequentially stack at least two organic emission layers of various suitable colors described above. In this case, the apparatus for manufacturing a display apparatus may deposit at least two layers of the intermediate layer 28-2 on the display substrate D, sequentially by using an identical (e.g., substantially identical) deposition unit. Here, a plurality of organic emission layers may be formed in one pixel. According to another embodiment, the apparatus for manufacturing a display apparatus as described above may also form one organic emission layer in one pixel as described above. In this case, the apparatus for manufacturing a display apparatus may arrange a mask assembly including a plurality of pattern-shaped openings to form a pattern-type organic emission layer by using the deposition unit, and then perform deposition, and may replace the mask assembly including a plurality of pattern-shaped openings with a mask assembly having one opening portion and then may form another layer that is not an organic emission layer.

When the apparatus for manufacturing a display apparatus as described above forms at least one layer of the thin film encapsulation layer E, the apparatus may form at least one of an inorganic layer and an organic layer of the thin film encapsulation layer E. In some embodiments, the apparatus for manufacturing a display apparatus may form an organic layer of the thin film encapsulation layer E.

The thin film encapsulation layer E may include a plurality of inorganic layers or an inorganic layer and an organic layer.

The organic layer of the thin film encapsulation layer E may be formed of a polymer, and may preferably be a single layer or a stacked layer formed of one selected from polyethylene terephthalate, polyimide, polycarbonate, epoxy, polyethylene, and polyacrylate. For example, the organic layer may be formed of polyacrylate, and in more detail, may include a polymerized monomer composition including a diacrylate-based monomer and a triacrylate-based monomer. A monoacrylate-based monomer may be further included in the monomer composition. In addition, the monomer composition may further include any suitable photo-initiator such as, for example, a 2,4,6-trimethylbenzoyl diphenylphosphine oxide (TPO), but the photo-initiator is not limited thereto.

The inorganic layer of the thin film encapsulation layer E may be a single layer or a stacked layer including a metal oxide and/or a metal nitride. In more detail, the inorganic layer may include one of $SiN_x$, $Al_2O_3$, $SiO_2$, and/or $TiO_2$.

An uppermost layer included in the thin film encapsulation layer E and exposed to the outside may include an inorganic layer to prevent or reduce permeation of moisture into the organic light-emitting device.

The thin film encapsulation layer E may include at least one sandwich structure in which at least one organic layer is inserted between at least two inorganic layers. As another example, the thin film encapsulation layer E may include at least one sandwich structure in which at least one inorganic layer is inserted between at least two organic layers. As another example, the thin film encapsulation layer E may include a sandwich structure in which at least one organic layer is inserted between at least two inorganic layers and at least one sandwich structure in which at least one inorganic layer is inserted between at least two organic layers.

The thin film encapsulation layer E may sequentially include, from an upper portion of the organic light-emitting device OLED, a first inorganic layer, a first organic layer, and a second inorganic layer.

As another example, the thin film encapsulation layer E may sequentially include, from an upper portion of the organic light-emitting device OLED, a first inorganic layer, a first organic layer, a second inorganic layer, a second organic layer, and a third inorganic layer.

As another example, the thin film encapsulation layer E may sequentially include, from an upper portion of the organic light-emitting device OLED, a first inorganic layer, a first organic layer, a second inorganic layer, a second organic layer, a third inorganic layer, a third organic layer, and a fourth inorganic layer.

A halogenated metal layer including LiF may be further included between the organic light-emitting device OLED and the first inorganic layer. The halogenated metal layer may prevent or reduce damage to the organic light-emitting device OLED when forming a first inorganic layer by using a sputtering method.

The first organic layer may have a smaller area than the second inorganic layer, and the second organic layer may also have a smaller area than the third inorganic layer.

Thus, the display apparatus 20 may realize precise images.

According to the carrier of the embodiments of the present disclosure, misalignment between a display substrate and a mask assembly during transportation of the substrate by using the carrier may be prevented or reduced.

According to embodiments of the present disclosure, the apparatus for manufacturing a display apparatus and the method of manufacturing a display apparatus of the embodiments of the present disclosure, various suitable layers may be formed on a display substrate by using chambers arranged in an in-line form.

In addition, according to embodiments of the present disclosure, the apparatus for manufacturing a display apparatus and the method of manufacturing a display apparatus of the embodiments of the present disclosure, the process may be simplified, and the process time may be reduced.

It should be understood that embodiments described herein should be considered in a descriptive sense only and not for purposes of limitation. Descriptions of features or aspects within each embodiment should typically be considered as available for other similar features or aspects in other embodiments.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While one or more embodiments have been described with reference to the figures, it will be understood by those of ordinary skill in the art that various changes in form and details may be made therein without departing from the spirit and scope as defined by the following claims, and equivalents thereof.

What is claimed is:

1. A method of manufacturing a display apparatus, the method comprising:
  sequentially fixing a display substrate and a mask assembly to a carrier;
  transporting the mask assembly and the display substrate to a deposition unit via the carrier; and
  depositing a deposition material on the display substrate by passing the deposition material through the mask assembly, by using the deposition unit,
  wherein the carrier comprises:
    a body portion;
    an electro permanent magnetic chuck arranged on a boundary portion of the body portion and configured to selectively fix the mask assembly; and
    a substrate fixing unit arranged in the body portion to selectively fix the display substrate.

2. The method of claim 1, wherein the carrier fixes the mask assembly by using the electro permanent magnetic chuck.

3. The method of claim 1, further comprising moving the mask assembly to approach the display substrate via a magnetic force.

4. The method of claim 1, further comprising separating the mask assembly from the carrier.

5. The method of claim 4, further comprising separating the display substrate from the carrier.

* * * * *